(12) United States Patent
Fukiage et al.

(10) Patent No.: US 10,900,121 B2
(45) Date of Patent: Jan. 26, 2021

(54) METHOD OF MANUFACTURING SEMICONDUCTOR DEVICE AND APPARATUS OF MANUFACTURING SEMICONDUCTOR DEVICE

(71) Applicant: TOKYO ELECTRON LIMITED, Tokyo (JP)

(72) Inventors: Noriaki Fukiage, Nirasaki (JP); Kentaro Oshimo, Nirasaki (JP); Shimon Otsuki, Nirasaki (JP); Hideomi Hane, Nirasaki (JP); Jun Ogawa, Nirasaki (JP); Hiroaki Ikegawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 440 days.

(21) Appl. No.: 15/816,864

(22) Filed: Nov. 17, 2017

(65) Prior Publication Data
US 2018/0142350 A1    May 24, 2018

(30) Foreign Application Priority Data

Nov. 21, 2016  (JP) ................................. 2016-226168

(51) Int. Cl.
*C23C 16/455*    (2006.01)
*C23C 16/04*     (2006.01)
(Continued)

(52) U.S. Cl.
CPC ...... *C23C 16/45544* (2013.01); *C23C 16/045* (2013.01); *C23C 16/345* (2013.01);
(Continued)

(58) Field of Classification Search
None
See application file for complete search history.

(56) References Cited

U.S. PATENT DOCUMENTS

| | | | |
|---|---|---|---|
| 4,854,266 A | 8/1989 | Simson et al. | |
| 5,281,274 A | 1/1994 | Yoder | |

(Continued)

FOREIGN PATENT DOCUMENTS

| | | | |
|---|---|---|---|
| CN | 1269046 A | 10/2000 | |
| CN | 101076878 A | 11/2007 | |

(Continued)

OTHER PUBLICATIONS

Machine Translation of JP-2012079762-A (Year: 2012).*

*Primary Examiner* — Shamim Ahmed
*Assistant Examiner* — Bradford M Gates
(74) *Attorney, Agent, or Firm* — Nath, Goldberg & Meyer; Jerald L. Meyer

(57) ABSTRACT

There is provided a film formation processing method for forming, in a vacuum atmosphere, a silicon nitride film along an inner wall surface of a recess constituting a pattern formed on a surface of a substrate, which includes: forming the silicon nitride film on the substrate by repeating, plural times, a process of supplying a raw material gas containing silicon to the substrate and subsequently, supplying an ammonia gas to the substrate to generate a silicon nitride on the substrate; and subsequently, modifying the silicon nitride film by activating a hydrogen gas and an ammonia gas and supplying the activated hydrogen gas and the activated ammonia gas to the substrate.

4 Claims, 11 Drawing Sheets

(51) Int. Cl.
  *C23C 16/56* (2006.01)
  *C23C 16/34* (2006.01)
(52) U.S. Cl.
  CPC .. *C23C 16/45502* (2013.01); *C23C 16/45551* (2013.01); *C23C 16/56* (2013.01)

(56) References Cited

U.S. PATENT DOCUMENTS

| | | |
|---|---|---|
| 5,620,523 A | 4/1997 | Maeda et al. |
| 5,744,049 A | 4/1998 | Hills et al. |
| 5,849,088 A | 12/1998 | Dedontney et al. |
| 5,906,354 A | 5/1999 | Gilbert et al. |
| 6,279,503 B1 | 8/2001 | Choi et al. |
| 6,340,501 B1 | 1/2002 | Kamiyama et al. |
| 6,634,314 B2 | 10/2003 | Hwang et al. |
| 6,933,245 B2 | 8/2005 | Lee et al. |
| 7,153,542 B2 | 12/2006 | Nguyen et al. |
| 8,034,723 B2 | 10/2011 | Ohizumi et al. |
| 8,092,598 B2 | 1/2012 | Baek et al. |
| 8,343,594 B2 | 1/2013 | Hasebe et al. |
| 8,372,202 B2 | 2/2013 | Kato et al. |
| 8,465,591 B2 | 6/2013 | Kato et al. |
| 8,465,592 B2 | 6/2013 | Kato et al. |
| 8,518,183 B2 | 8/2013 | Honma et al. |
| 8,673,079 B2 | 3/2014 | Kato et al. |
| 8,673,395 B2 | 3/2014 | Kato et al. |
| 8,721,790 B2 | 5/2014 | Kato et al. |
| 8,746,170 B2 | 6/2014 | Orito et al. |
| 8,808,456 B2 | 8/2014 | Kato et al. |
| 8,835,332 B2 | 9/2014 | Kato et al. |
| 8,840,727 B2 | 9/2014 | Kato et al. |
| 8,845,857 B2 | 9/2014 | Ohizumi et al. |
| 8,854,449 B2 | 10/2014 | Aikawa et al. |
| 8,882,915 B2 | 11/2014 | Kato et al. |
| 8,882,916 B2 | 11/2014 | Kumagai et al. |
| 8,906,246 B2 | 12/2014 | Kato et al. |
| 8,951,347 B2 | 2/2015 | Kato et al. |
| 8,961,691 B2 | 2/2015 | Kato et al. |
| 8,962,495 B2 | 2/2015 | Ikegawa et al. |
| 8,992,685 B2 | 3/2015 | Kato et al. |
| 9,023,738 B2 | 5/2015 | Kato et al. |
| 9,040,434 B2 | 5/2015 | Kato |
| 9,053,909 B2 | 6/2015 | Kato et al. |
| 9,103,030 B2 | 8/2015 | Kato et al. |
| 9,111,747 B2 | 8/2015 | Yamawaku et al. |
| 9,136,133 B2 | 9/2015 | Oshimo et al. |
| 9,214,333 B1 | 12/2015 | Sims et al. |
| 9,714,467 B2 | 7/2017 | Kato et al. |
| 2002/0195056 A1 | 12/2002 | Sandhu et al. |
| 2003/0228770 A1 | 12/2003 | Lee et al. |
| 2004/0052972 A1 | 3/2004 | Schmitt |
| 2006/0014384 A1 | 1/2006 | Lee et al. |
| 2006/0177579 A1 | 8/2006 | Shin et al. |
| 2006/0196538 A1 | 9/2006 | Kubista et al. |
| 2006/0269693 A1 | 11/2006 | Balseanu et al. |
| 2007/0215036 A1 | 9/2007 | Park et al. |
| 2007/0218701 A1 | 9/2007 | Shimizu et al. |
| 2007/0218702 A1 | 9/2007 | Shimizu et al. |
| 2008/0124945 A1 | 5/2008 | Miya et al. |
| 2008/0207007 A1 | 8/2008 | Thridandam et al. |
| 2008/0208385 A1 | 8/2008 | Sakamoto et al. |
| 2008/0216864 A1 | 9/2008 | Sexton et al. |
| 2008/0242116 A1 | 10/2008 | Clark |
| 2009/0272402 A1 | 11/2009 | Kim et al. |
| 2009/0324826 A1 | 12/2009 | Kato et al. |
| 2009/0324828 A1 | 12/2009 | Kato et al. |
| 2010/0050942 A1 | 3/2010 | Kato et al. |
| 2010/0050943 A1 | 3/2010 | Kato et al. |
| 2010/0050944 A1 | 3/2010 | Kato et al. |
| 2010/0055297 A1 | 3/2010 | Kato et al. |
| 2010/0055312 A1 | 3/2010 | Kato et al. |
| 2010/0055314 A1 | 3/2010 | Kato et al. |
| 2010/0055315 A1 | 3/2010 | Honma |
| 2010/0055316 A1 | 3/2010 | Honma |
| 2010/0055319 A1 | 3/2010 | Kato et al. |
| 2010/0055320 A1 | 3/2010 | Honma |
| 2010/0055347 A1 | 3/2010 | Kato et al. |
| 2010/0055351 A1 | 3/2010 | Kato et al. |
| 2010/0116210 A1 | 5/2010 | Kato et al. |
| 2010/0124610 A1 | 5/2010 | Aikawa et al. |
| 2010/0132614 A1 | 6/2010 | Kato et al. |
| 2010/0132615 A1 | 6/2010 | Kato et al. |
| 2010/0136795 A1 | 6/2010 | Honma |
| 2010/0151131 A1 | 6/2010 | Obara et al. |
| 2010/0227046 A1 | 9/2010 | Kato et al. |
| 2010/0227059 A1 | 9/2010 | Kato et al. |
| 2010/0260935 A1 | 10/2010 | Kato et al. |
| 2010/0260936 A1 | 10/2010 | Kato et al. |
| 2011/0039026 A1 | 2/2011 | Kato et al. |
| 2011/0048326 A1 | 3/2011 | Kato et al. |
| 2011/0086516 A1 | 4/2011 | Lee et al. |
| 2011/0100489 A1 | 5/2011 | Orito et al. |
| 2011/0104395 A1 | 5/2011 | Kumagai et al. |
| 2011/0126985 A1 | 6/2011 | Ohizumi et al. |
| 2011/0139074 A1 | 6/2011 | Kato et al. |
| 2011/0151122 A1 | 6/2011 | Kato et al. |
| 2011/0155056 A1 | 6/2011 | Kato et al. |
| 2011/0155057 A1 | 6/2011 | Kato et al. |
| 2011/0159187 A1 | 6/2011 | Kato et al. |
| 2011/0159188 A1 | 6/2011 | Kato et al. |
| 2011/0159702 A1 | 6/2011 | Ohizumi et al. |
| 2011/0214611 A1 | 9/2011 | Kato et al. |
| 2011/0236598 A1 | 9/2011 | Kumagai et al. |
| 2012/0009802 A1 | 1/2012 | Lavoie et al. |
| 2012/0075460 A1 | 3/2012 | Aikawa et al. |
| 2012/0076937 A1 | 3/2012 | Kato et al. |
| 2012/0222615 A1 | 9/2012 | Kato et al. |
| 2012/0267341 A1 | 10/2012 | Kato et al. |
| 2013/0059415 A1 | 3/2013 | Kato et al. |
| 2013/0122718 A1 | 5/2013 | Kato et al. |
| 2013/0251904 A1 | 9/2013 | Kato et al. |
| 2013/0337635 A1 | 12/2013 | Yamawaku et al. |
| 2013/0337658 A1 | 12/2013 | Ikegawa et al. |
| 2014/0017909 A1 | 1/2014 | Kato |
| 2014/0170859 A1 | 6/2014 | Yamawaku et al. |
| 2014/0174351 A1 | 6/2014 | Aikawa |
| 2014/0199856 A1 | 7/2014 | Kato et al. |
| 2014/0206133 A1 | 7/2014 | Koezuka et al. |
| 2014/0213068 A1 | 7/2014 | Kato et al. |
| 2014/0220260 A1 | 8/2014 | Yamawaku et al. |
| 2014/0237530 A1 | 8/2014 | Delorme |
| 2014/0273527 A1 | 9/2014 | Niskanen et al. |
| 2014/0273530 A1 | 9/2014 | Nguyen et al. |
| 2014/0345523 A1 | 11/2014 | Kikuchi et al. |
| 2014/0349032 A1 | 11/2014 | Kato et al. |
| 2015/0011087 A1 | 1/2015 | Oshimo et al. |
| 2015/0024143 A1 | 1/2015 | Kumagai et al. |
| 2015/0031218 A1* | 1/2015 | Karakawa ........... H01L 21/0217 438/792 |
| 2015/0078864 A1 | 3/2015 | Sato et al. |
| 2015/0079807 A1 | 3/2015 | Tamura et al. |
| 2015/0184293 A1 | 7/2015 | Kato et al. |
| 2015/0184294 A1 | 7/2015 | Kato et al. |
| 2015/0187560 A1 | 7/2015 | Kim et al. |
| 2015/0214029 A1 | 7/2015 | Hane et al. |
| 2015/0225849 A1 | 8/2015 | Kato et al. |
| 2016/0079054 A1* | 3/2016 | Chen ................ C23C 16/45553 438/762 |
| 2017/0218510 A1 | 8/2017 | Kato et al. |
| 2017/0263437 A1 | 9/2017 | Li et al. |
| 2018/0308681 A1 | 10/2018 | Harada et al. |
| 2018/0350668 A1 | 12/2018 | Cheng et al. |

FOREIGN PATENT DOCUMENTS

| | | |
|---|---|---|
| JP | 4287912 A | 10/1992 |
| JP | 3144664 B2 | 3/2001 |
| JP | 2001254181 A | 9/2001 |
| JP | 2006278497 A | 10/2006 |
| JP | 2007247066 A | 9/2007 |
| JP | 2007281082 A | 10/2007 |
| JP | 201016136 A | 1/2010 |
| JP | 2010283357 A | 12/2010 |
| JP | 201161218 A | 3/2011 |

(56) References Cited

FOREIGN PATENT DOCUMENTS

| JP | 2012079762 A | * | 4/2012 | ......... H01L 21/0217 |
|----|--------------|---|--------|------------------------|
| JP | 2012079762 A |   | 4/2012 | |
| JP | 2013055243 A |   | 3/2013 | |
| JP | 2013161874 A |   | 8/2013 | |
| JP | 2013165116 A |   | 8/2013 | |
| JP | 2014165402 A |   | 9/2014 | |
| JP | 2015165549 A |   | 9/2015 | |
| JP | 5882777 B2   |   | 2/2016 | |
| JP | 5882777 B2   |   | 3/2016 | |
| WO | 2006065014 A1 |  | 6/2006 | |
| WO | 2006088062 A1 |  | 8/2006 | |
| WO | 2013137115 A1 |  | 9/2013 | |

* cited by examiner

METHOD OF MANUFACTURING SEMICONDUCTOR DEVICE AND APPARATUS OF MANUFACTURING SEMICONDUCTOR DEVICE

CROSS-REFERENCE TO RELATED APPLICATION

This application is based upon and claims the benefit of priority from Japanese Patent Application No. 2016-226168, filed on Nov. 21, 2016, the entire contents of which are incorporated herein by reference.

TECHNICAL FIELD

The present disclosure relates to a technique for forming a silicon nitride film along an inner wall surface of a recess which constitutes a pattern formed on a surface of a substrate.

BACKGROUND

In a semiconductor manufacturing process, there is a case where a silicon nitride film (hereinafter sometimes abbreviated as "SiN film") is formed as, for example, an underlying film of a sacrificial film, on a substrate on which a recess constituting a pattern is formed. For example, a film formation processing apparatus that forms a SiN film by ALD (Atomic Layer Deposition) has been used.

In this film formation processing apparatus, a film formation process is performed inside a processing chamber by rotating (revolving) a mounting table about an axis line so that a substrate mounting region formed in the mounting table sequentially passes through a first region and a second region inside the processing chamber. In the first region, a dichlorosilane (DCS) gas is supplied from an injection portion of a first gas supply part so that Si is adsorbed onto the substrate. An unnecessary DCS gas is exhausted from an exhaust port formed so as to surround the injection portion. A nitrogen ($N_2$) gas or an ammonia ($NH_3$) gas, which is a reaction gas, is supplied to the second region and excited therein. The Si adsorbed onto the substrate is nitrided by active species of the reaction gas to form a SiN film.

A dense SiN film is formed using ALD. However, depending on the application, for example, when the SiN film is used as an underlying film of a sacrificial film, the denseness of the SiN film should be further enhanced. In addition, when an aspect ratio is increased due to miniaturization of a pattern, a gas cannot be sufficiently supplied to a lower side of a recess constituting the pattern. Thus, there may be a case where it is difficult to make the film quality of the SiN film uniform in the longitudinal direction of the recess. When the film quality of the SiN film in the longitudinal direction of the recess becomes uneven as described above, the etching rate of the SiN film in the longitudinal direction of the recess is not made uniform in a subsequent etching process of the sacrificial film. Therefore, for example, in a case where a wiring material is embedded after the sacrificial film is removed with the SiN film failing to sufficiently play the role of the underlying film, there is a concern that the electrical characteristics of a device may be adversely affected.

SUMMARY

Some embodiments of the present disclosure provide a technique capable of, when forming a silicon nitride film along an inner wall surface of a recess constituting a pattern formed on a surface of substrate, enhancing the uniformity of a film quality of the silicon nitride film in a longitudinal direction of the recess while making the silicon nitride film dense.

According to one embodiment of the present disclosure, there is provided a film formation processing method for forming, in a vacuum atmosphere, a silicon nitride film along an inner wall surface of a recess constituting a pattern formed on a surface of a substrate, which includes: forming the silicon nitride film on the substrate by repeating, plural times, a process of supplying a raw material gas containing silicon to the substrate and subsequently, supplying an ammonia gas to the substrate to generate a silicon nitride on the substrate; and subsequently, modifying the silicon nitride film by activating a hydrogen gas and an ammonia gas and supplying the activated hydrogen gas and the activated ammonia gas to the substrate.

According to another embodiment of the present disclosure, there is provided a film formation processing apparatus for forming, in a vacuum atmosphere, a silicon nitride film along an inner wall surface of a recess constituting a pattern formed on a surface of a substrate, which includes: a vacuum container in which a mounting part for mounting the substrate thereon is installed; a raw material gas supply part configured to supply a raw material gas containing silicon to the substrate; a reaction gas supply part configured to supply an ammonia gas to the substrate; a modification gas supply part configured to supply a hydrogen gas and an ammonia gas to the substrate; an exhaust mechanism configured to evacuate an interior of the vacuum container; and a control part configured to execute: forming the silicon nitride film on the substrate by repeating, plural times, a process of supplying the raw material gas containing silicon to the substrate and subsequently supplying the ammonia gas to the substrate to generate a silicon nitride on the substrate; and subsequently, modifying the silicon nitride film formed on the substrate by activating the hydrogen gas and the ammonia gas in the vacuum atmosphere and supplying the activated hydrogen gas and the activated ammonia gas to the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, a configuration of a film formation processing apparatus according to an embodiment of the present disclosure will be described with reference to FIGS. 1 to 5. In the present embodiment, there will be described an example in which a thin film of a silicon nitride film (SiN film) is formed on a semiconductor wafer (hereinafter referred to as "wafer") W used as a substrate by reacting a raw material gas containing silicon (Si), for example, a dichlorosilane ($SiH_2Cl_2$: DCS) gas, with an ammonia ($NH_3$) gas. In this specification, the silicon nitride film is described as SiN regardless of the stoichiometric ratio of Si and N. Accordingly, the description of SiN includes, for example, $Si_3N_4$.

Figure 1:
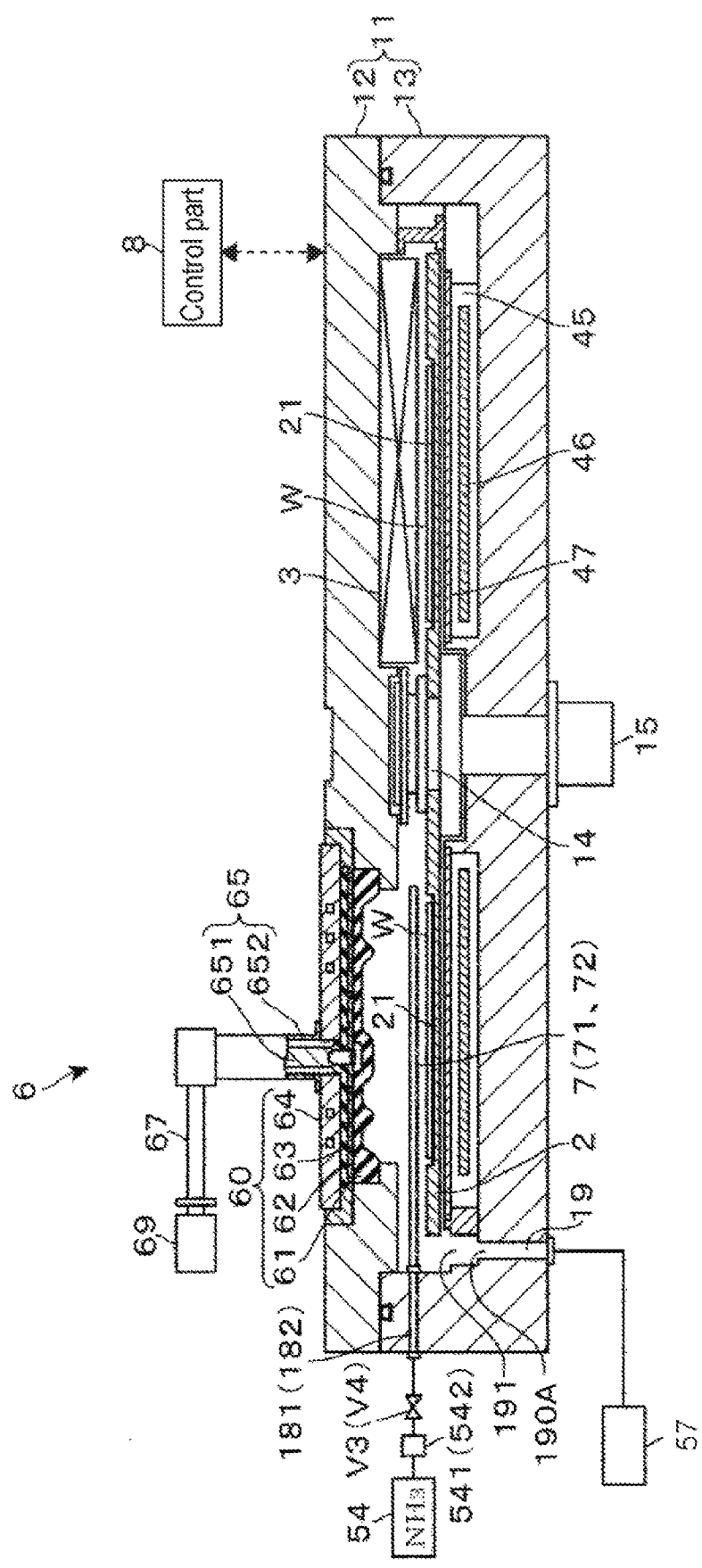
FIG. 1 is a vertical sectional side view of a film formation processing apparatus according to an embodiment of the present disclosure.
Figure 2:
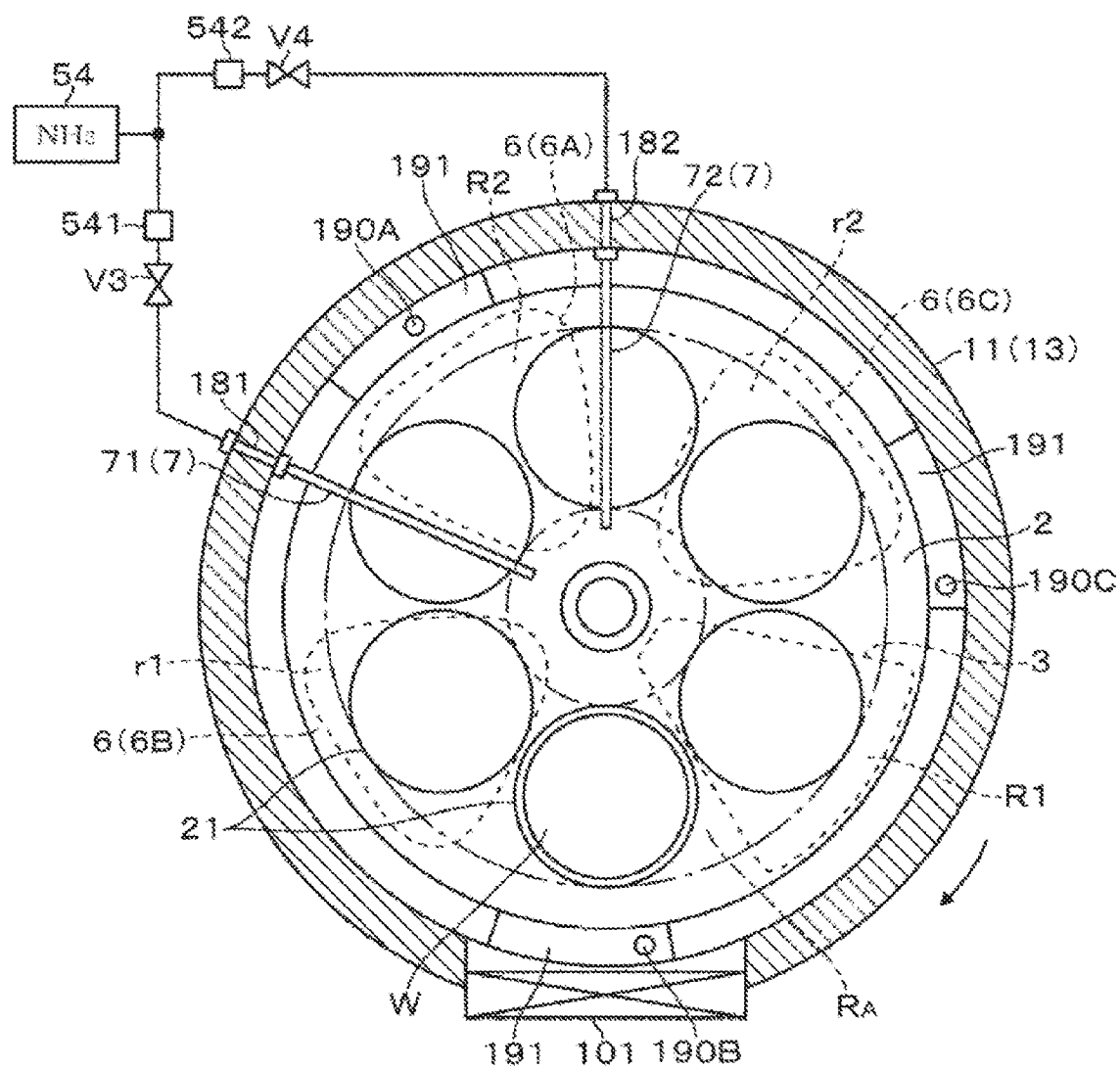
FIG. 2 is a transverse sectional plan view of the film formation processing apparatus.

As shown in FIGS. 1 and 2, the film formation processing apparatus of the present disclosure includes a vacuum container 11 defining a process space in which a film formation process is performed. The vacuum container 11 includes a container body 13 which defines a side wall and a bottom wall of the vacuum container 11, and a top plate 12 which airtightly closes an upper opening of the container body 13. A disk-shaped rotary table 2 is installed inside the vacuum container 11 and is configured to be rotatable about a vertical axis by a rotary drive mechanism 15 such as a motor or the like via a rotary shaft 14 extending vertically downward.

Figure 3:
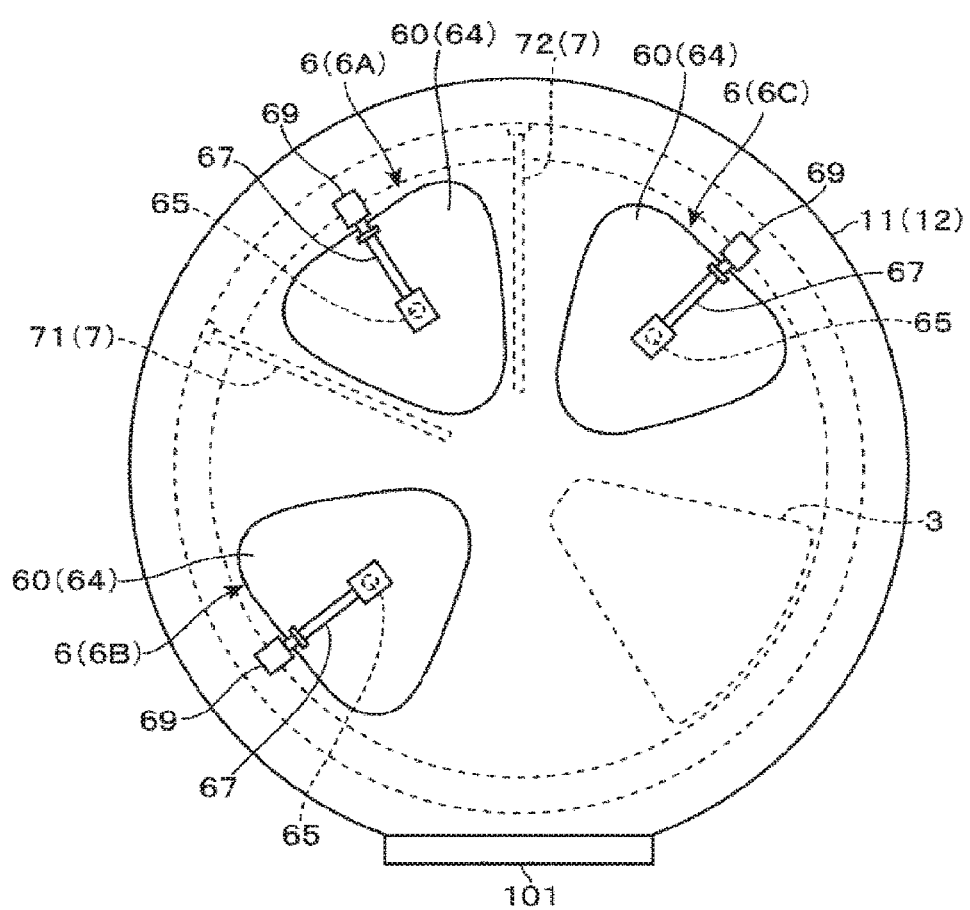
FIG. 3 is a plan view of the film formation processing apparatus as viewed from the top side.

On the upper surface of the rotary table 2, as shown in FIG. 2, for example, six mounting regions 21 are arranged around the rotational center in the circumferential direction. Each of the mounting regions 21 is configured as a circular recess having a slightly larger diameter than that of the wafer W. The mounting regions 21 constitute mounting portions on which substrates are mounted. As shown in FIG. 1, a flat annular groove portion 45 is formed in the bottom surface of the container body 13 along the circumferential direction of the rotary table 2. A heater 46 is disposed inside the annular groove portion 45. As shown in FIGS. 2 and 3, a loading/unloading port 101 configured to be opened and closed by a gate valve (not shown) is formed in a side wall surface of the vacuum container 11 (the container body 13). A wafer W held by an external transfer mechanism (not shown) is loaded into the vacuum container 11 via the loading/unloading port 101 and is delivered onto each of the mounting regions 21 of the rotary table 2 using lift pins (not shown).

The film formation processing apparatus includes a raw material gas unit 3 constituting a raw material gas supply part. As shown in FIG. 1, the raw material gas unit 3 is installed on the lower surface of the top plate 12 facing the upper surface of the rotary table 2. As shown in FIGS. 2 and 3, the plan-view shape of the raw material gas unit 3 is a fan shape formed by partitioning a revolution plane $R_A$ of the mounting regions 21 in a direction intersecting with a revolution direction of the mounting regions 21. The revolution plane $R_A$ is an annular region surrounded by a one-dot chain line in FIG. 2, namely a region through which the mounting regions 21 pass when the rotary table 2 is rotated.

Figure 4:
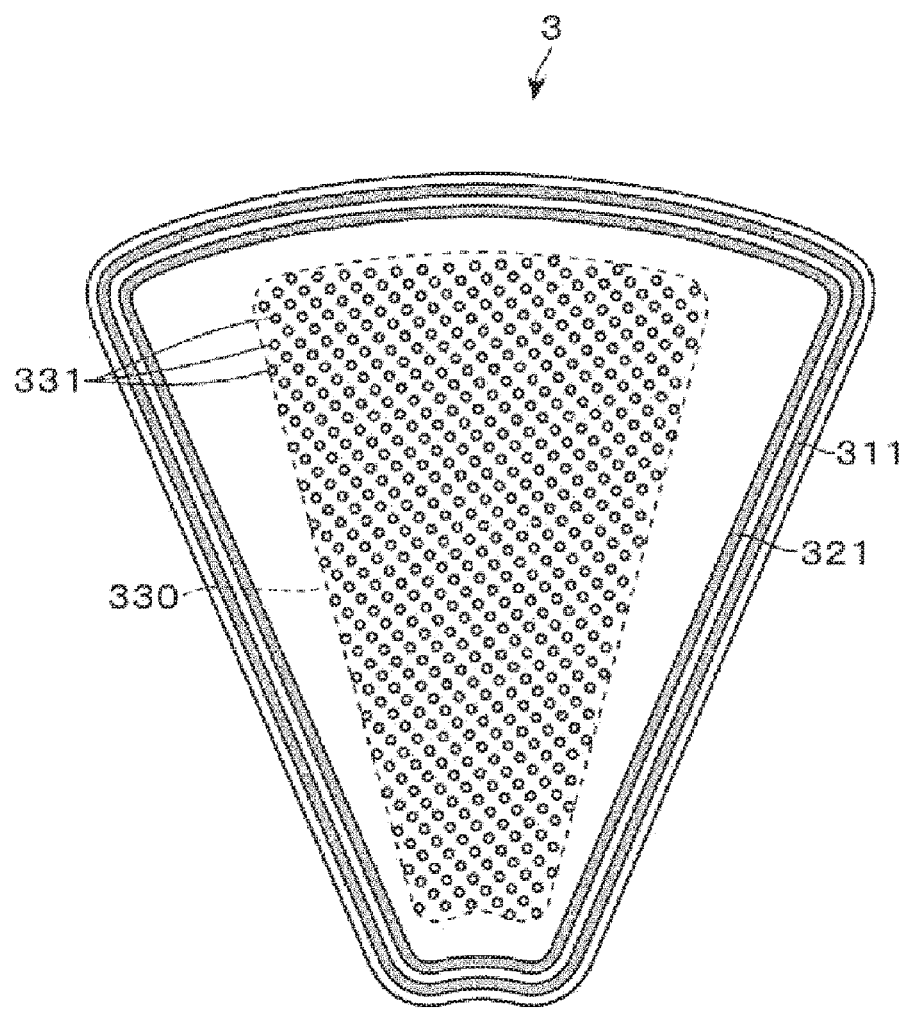
FIG. 4 is a plan view of a raw material gas unit installed in a first region as viewed from the lower side.

As shown in FIG. 4, gas discharge ports 331, an exhaust port 321 and a purge gas discharge port 311, which constitute a discharge part, are opened in the lower surface of the raw material gas unit 3. In FIG. 4, in order to facilitate discrimination, the exhaust port 321 and the purge gas discharge port 311 are indicated by a large number of dots. The large number of gas discharge ports 331 are arranged in a fan-shaped region 330 inward of the peripheral edge of the lower surface of the raw material gas unit 3. The gas discharge ports 331 discharge a DCS gas as the raw material gas downward in the form of a shower. The raw material gas containing silicon is not limited to the DCS gas. For example, hexachlorodisilane (HCD), tetrachlorosilane (TCS) or the like may be used as the raw material gas containing silicon. Gas flow paths (not shown) are formed in the raw material gas unit 3 so that the raw material gas can be supplied independently to the respective gas discharge ports 331. Upstream sides of the gas flow paths are connected to a DCS gas supply source via a pipe provided with a gas supply device composed of a valve and a mass flow controller. The illustration of the gas supply device, the pipe and the DCS gas supply source is omitted herein.

The exhaust port 321 and the purge gas discharge port 311 are annularly opened in the peripheral edge of the lower surface of the raw material gas unit 3 so as to surround the fan-shaped region 330 and face the upper surface of the rotary table 2. The purge gas discharge port 311 is positioned outward of the exhaust port 321. A region inward of the exhaust port 321 above the rotary table 2 constitutes an adsorption region R1 where the adsorption of the raw material gas onto the surface of the wafer W is performed. An exhaust mechanism (not shown) is connected to the exhaust port 321. A supply source (not shown) of a purge gas, for example, an argon (Ar) gas, is connected to the purge gas discharge port 311.

During the film formation process, the discharge of the raw material gas from the gas discharge ports 331, the exhaust of the raw material gas from the exhaust port 321 and the discharge of the purge gas from the purge gas discharge port 311 are performed together. Thus, the raw material gas and the purge gas discharged toward the rotary table 2 are directed to the exhaust port 321 along the upper surface of the rotary table 2 and are exhausted from the exhaust port 321. By performing the discharge and exhaust of the purge gas in this way, the atmosphere in the adsorption region R1 is separated from the external atmosphere so that the raw material gas can be limitedly supplied to the adsorption region R1. In addition to such a role of separating the atmosphere, the purge gas also plays a role of removing excessive raw material gas adsorbed onto the wafer W.

Subsequently, a reaction region R2 to which a plasmarized $NH_3$ gas is supplied will be described. As shown in FIG. 2, the reaction region R2 is defined apart from the raw material gas unit 3 in the rotational direction of the rotary table 2 (in this embodiment, clockwise when viewed from the upper side). In the reaction region R2, there are provided two gas injectors 71 and 72 that constitute a reaction gas supply part for supplying an $NH_3$ gas to the wafer W. The gas injectors 71 and 72 are formed in an elongated rod shape so as to extend in the radial direction of the rotary table 2 (in the direction crossing the revolution direction of the mounting regions 21). The two gas injectors 71 and 72 are inserted in a mutually spaced-apart relationship along the circumferential direction of the rotary table 2. For example, one gas injector 71 is installed at the upstream side of the reaction region R2 in the rotational direction. The other gas injector 72 is installed at the downstream side of the reaction region R2 in the rotational direction.

Each of the gas injectors 71 and 72 is inserted substantially horizontally from the side wall surface of the vacuum container 11 (the container body 13) toward the rotational center of the rotary table 2. The interior of each of the gas injectors 71 and 72 is hollow. A flow path through which a gas flows in the length direction thereof is formed in the interior of each of the gas injectors 71 and 72. A plurality of gas discharge holes (not shown) is formed in the side surfaces of the gas injectors 71 and 72 in a mutually spaced-apart relationship over a range where an $NH_3$ gas can be supplied to the entire surface of the wafer W mounted on each of the mounting regions 21. The gas injectors 71 and 72 are connected to an $NH_3$ gas supply source 54 via opening/closing valves V3 and V4, and flow rate adjustment parts 541 and 542, respectively. A supply source (not shown) of an inert gas, for example, an Ar gas, is connected to each of the gas injectors 71 and 72 and is configured to supply an Ar gas whose flow rate is adjusted, at a predetermined timing.

Next, a configuration of a plasma formation part 6 (6A) which constitutes a plasmarization mechanism for plasmarizing an $NH_3$ gas will be described. The plasma formation part 6A is configured in the same manner as the plasma formation parts 6 (6B and 6C) installed in first and second modification regions r1 and r2 to be described later, and therefore, description will be made with reference to FIGS. 1 and 5. The plasma formation part 6 includes an antenna part 60 that radiates microwaves toward the inside of the vacuum container 11, a coaxial waveguide 65 that supplies the microwaves toward the antenna part 60, and a microwave generator 69. The antenna part 60 is installed in the top plate 12 at a position above the reaction region R2. The antenna part 60 closes a substantially triangular opening corresponding to the reaction region R2.

The antenna part 60 is configured as a radial line slot antenna (RLSA (registered trademark of Tokyo Electron Limited)) that includes a dielectric window 61, a slot plate 62, a dielectric plate 63 and a cooling jacket 64. The dielectric window 61 is to shorten the wavelength of microwaves. The peripheral edge portion of the dielectric window 61 is supported by a member existing around the opening formed in the top plate 12. A large number of slot holes 621 are formed in the slot plate 62. The dielectric plate 63 is installed on the slot plate 62.

Figure 5:
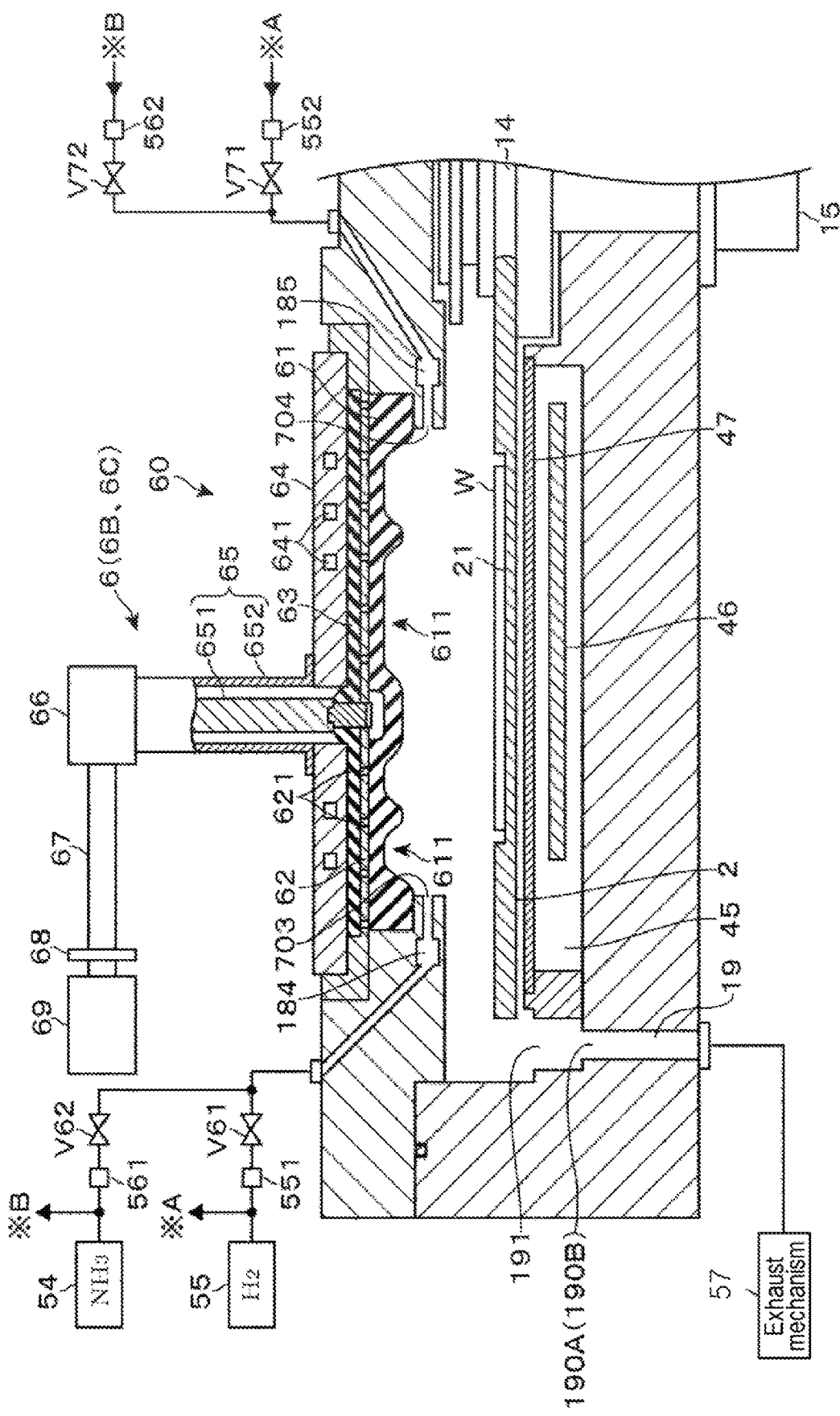
FIG. 5 is an enlarged vertical sectional side view of a first modification region or a second modification region formed in the film formation processing apparatus.

In FIGS. 1 and 5, reference numeral 651 denotes an inner conductor of the coaxial waveguide 65, and reference numeral 652 denotes an outer conductor of the coaxial waveguide 65. The coaxial waveguide 65 is connected to the microwave generator 69 via a mode converter 66, a waveguide 67 and a tuner 68 which is a matcher. The microwave generator 69 generates microwaves having a frequency of, for example, 2.45 GHz. In the plasma formation part 6, the microwaves generated by the microwave generator 69 are supplied to the dielectric plate 63 through the coaxial waveguide 65 and are supplied to a space below the dielectric window 61 from the dielectric window 61 via the slot holes 621 of the slot plate 62. Thus, when the rotary table 2 is rotated, the wafer W mounted on each of the mounting regions 21 passes through the reaction region R2, whereby the plasmarized $NH_3$ gas is supplied to the entire surface of the wafer W.

Furthermore, as shown in FIG. 2, in the bottom surface of the container body 13 between the rotary table 2 and the inner wall surface of the vacuum container 11, an exhaust groove 191 for discharging the $NH_3$ gas therethrough is formed outward of the region where the reaction region R2 is formed, along the circumferential direction of the rotary table 2. An exhaust port 190A is opened in the bottom of the exhaust groove 191. An exhaust mechanism 57 for evacuating the inside of the vacuum container 11 is connected to the exhaust port 190A via an exhaust path 19.

In addition, the film formation processing apparatus includes a first modification region r1 and a second modification region r2 which perform a modification process with respect to the SiN film. As shown in FIG. 2, the first modification region r1 is defined at the downstream side of the adsorption region R1 and the upstream side of the reaction region R2 when viewed along the rotational direction of the rotary table 2. On the other hand, the second modification region r2 is defined at the downstream side of the reaction region R2 and the upstream side of the adsorption region R1 when viewed along the rotational direction. Each of the first modified region r1 and the second modified region r2 is formed as a substantially triangular region obtained by partitioning the above-described revolution plane $R_4$, through which the mounting regions 21 passes, in the direction intersecting with the revolution direction.

Respective devices installed in the first modification region r1 and the second modification region r2 have a common configuration. Thus, the first modification region r1 will be described by way of example with reference to FIG. 5 which is a common enlarged vertical sectional side view. As shown in FIG. 5, in the first modification region r1, there are formed first gas discharge ports 703 for supplying a modification gas into the first modification region r1 from the peripheral side of the rotary table 2 toward the central side thereof, and second gas discharge ports 704 for supplying a modification gas into the first modification region r1 from the central side of the rotary table 2 toward the peripheral side thereof. A combination of the first gas discharge ports 703 and the second gas discharge ports 704 constitutes a modification gas supply part for supplying an $H_2$ gas and an $NH_3$ gas, which are modification gases, to the wafer W.

The first gas discharge ports 703 are formed in the inner peripheral surface of the opening formed in the top plate 12 which supports the dielectric window 61, so that a gas can be supplied toward a region under the dielectric window 61 installed in the antenna part 60 of the plasma formation part 6 (6B) to be described later. The first gas discharge ports 703 are arranged at multiple positions in a mutually spaced-apart relationship along one side of the peripheral side of the rotary table 2 in the first modification region r1. The first gas discharge ports 703 communicate with a first gas supply path 184 formed to extend along the one side of the peripheral side of the first modification region r1.

The second gas discharge ports 704 are formed at multiple positions (for example, two positions) in a mutually spaced-apart relationship along a vertex-side region of a substantially triangular shape, which is opposite the one side of the peripheral side where the first gas discharge ports 703 are formed. The second gas discharge ports 704 communicate with a common second gas supply path 185 formed in the vertex-side region of the first modification region r1.

In this example, the modification process includes a first modification process performed during the cycle of the film formation process (to be described later) and a second modification process performed after the cycle of the film formation process. A hydrogen ($H_2$) gas is used as the modification gas in the first modification process. An $H_2$ gas and an $NH_3$ gas are used as the modification gas in the second modification process. To this end, the first gas supply path 184 is connected to an $H_2$ gas supply source 55 via an opening/closing valve V61 and a flow rate adjustment part 551 and is also connected to an $NH_3$ gas supply source 54 via an opening/closing valve V62 and a flow rate adjustment part 561. Similarly, the second gas supply path 185 is connected to the $H_2$ gas supply source 55 via an opening/closing valve V71 and a flow rate adjustment part 552 and is also connected to the $NH_3$ gas supply source 54 via an opening/closing valve V72 and a flow rate adjustment part 562. Thus, the $H_2$ gas and the $NH_3$ gas are discharged into the vacuum container 11 from the first gas discharge ports 703 and the second gas discharge ports 704, while being mixed with each other in the middle of respective pipes at the downstream sides of the valves V61 and V71, respectively.

Furthermore, as shown in FIGS. 3 and 5, the plasma formation part 6 (6B) which constitutes a plasmarization mechanism for plasmarizing the modification gas is installed in the first modification region r1. A configuration of the plasma formation part 6B is common to the configuration of the plasma formation part 6A for the reaction gas described with reference to FIG. 6 and therefore, the repeated description will be omitted. Moreover, when viewed along the rotational direction of the rotary table 2, in the bottom surface side of the container body 13 between the rotary table 2 and the inner wall surface of the vacuum container 11 in the upstream side of the first modification region r1, there is formed an exhaust groove 191 including an exhaust port 190B through which the modification gas is discharged outward of the vacuum container 11.

The second modification region r2 is configured similarly to the first modification region r1. Further, a configuration of the plasma formation part 6 (6C) that constitutes a plasmarization mechanism for plasmarizing the modification gas is similar to the configuration of the plasma formation part 6A. An exhaust port 190C for the modification gas is formed at the downstream side of the second modification region r2 in the rotational direction.

In the first modification region r1 and the second modification region r2, the modification gas is discharged from the first gas discharge ports 703 formed at the peripheral side of the rotary table 2 and the second gas discharge ports 704 formed at the central side of the rotary table 2 in the direction intersecting with the revolution direction of the mounting regions 21. In the first modification region r1, the modification gas flows toward the exhaust port 190B formed at the upstream side in the rotational direction in a direction away from the reaction region R2. In the second modification region r2, the modification gas flows toward the exhaust port 190C formed at the downstream side in the rotational direction in a direction away from the reaction region R2.

Figure 6:
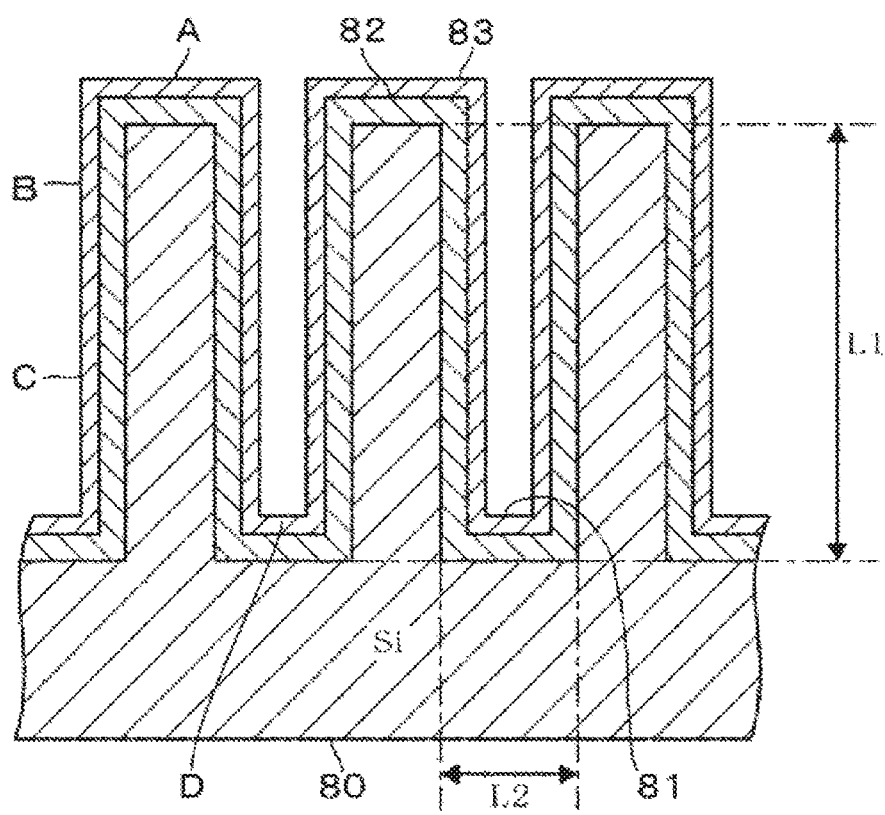
FIG. 6 is a vertical sectional side view of a wafer surface on which a SiN film is formed according to the present disclosure.
Figure 7:
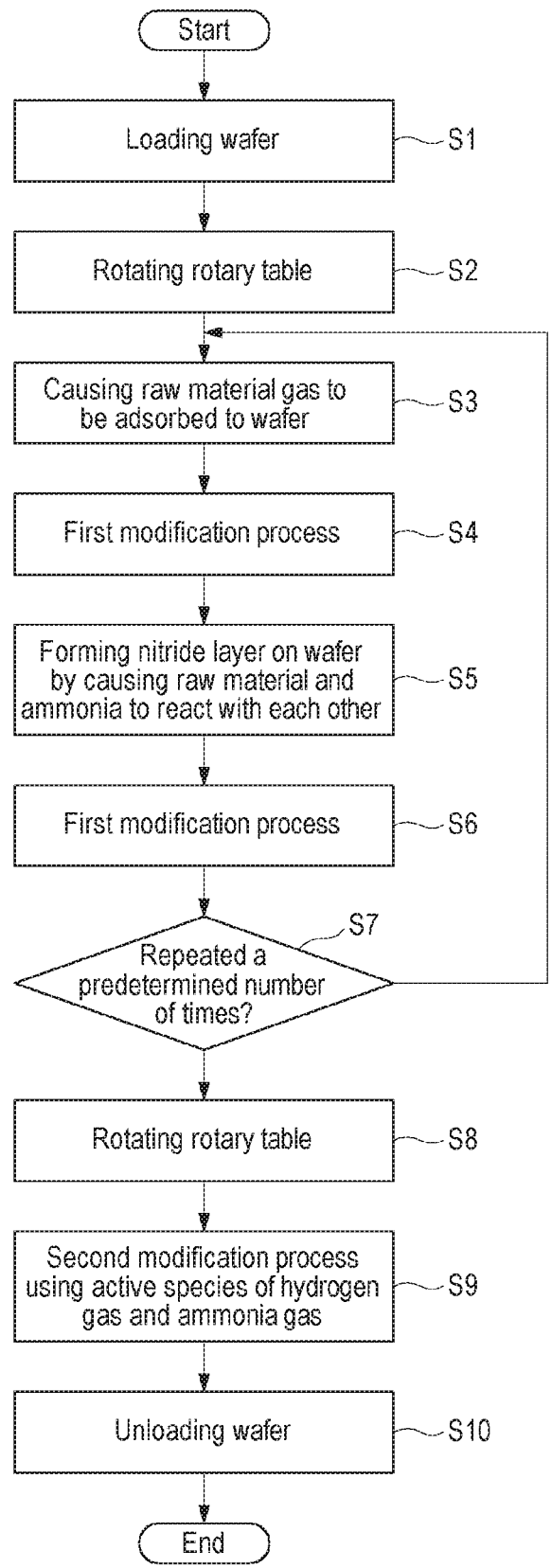
FIG. 7 is a flowchart showing an example of a film formation processing method of the present disclosure.

Hereinafter, an example of a film formation processing method of the present disclosure, which is carried out using the above-described film formation processing apparatus, will be described with reference to FIGS. 6 and 7. First, an example of a surface structure of the wafer W will be briefly described with reference to FIG. 6. FIG. 6 is a vertical sectional side view of the surface of the wafer W after a SiN film is formed by the film formation processing apparatus. In FIG. 6, reference numeral 80 denotes a silicon substrate in which a recess 81 constituting a pattern is formed. An $SiO_2$ film 82 and an SiN film 83 are sequentially stacked on the surface of the silicon substrate. The SiN film 83 is formed by the film formation processing method of the present disclosure. Thereafter, for example, a sacrificial film made of, for example, an organic film (not shown), is embedded in the recess 81. The sacrificial film is removed by etching. In FIG. 6, the depth and the width of the recess 81 of the wafer W are indicated as L1 and L2, respectively. The aspect ratio L1/L2 is, for example, 5 to 40.

In the film formation processing method of the present disclosure, first, a step of forming a SiN film on the wafer W is executed by repeating, multiple times, a process of supplying a raw material gas to the wafer W and then supplying an $NH_3$ gas to the wafer W, thereby producing a nitride of Si on the wafer W. In this step, first, the gate valve of the loading/unloading port 101 is opened. The wafer W is loaded into the vacuum container 11 by an external transfer mechanism. Then, the wafer W is delivered onto one of the mounting regions 21 of the rotary table 2 using lift pins (not shown) (step S1). The delivery of the wafer W is performed by intermittently rotating the rotary table 2, whereby the wafers W are mounted on all the mounting regions 21. Subsequently, the transfer mechanism is moved back and the gate valve of the loading/unloading port 101 is closed. At this time, the interior of the vacuum container 11 is exhausted to a predetermined pressure in advance by the exhaust mechanism 57 and the exhaust mechanism of the raw material gas unit 3. In addition, a purge gas is supplied from the purge gas discharge port 311.

Thereafter, the rotary table 2 is rotated in a clockwise direction and the wafer W is heated by the heater 46 while maintaining a preset rotation speed (step S2). If it is determined by a temperature sensor (not shown) that the temperature of the wafer W has reached a predetermined set temperature, for example, 475 degrees C., the supply of a raw material gas (DCS gas) from the gas discharge ports 331 of the raw material gas unit 3, the supply of an $NH_3$ gas and an Ar gas from the gas injectors 71 and 72 installed in the reaction region R2, and the supply of an $H_2$ gas from the first gas discharge ports 703 and the second gas discharge ports 704 formed in the first modification region r1 and the second modification region r2 are started, respectively. In addition, simultaneously with the start of the supply of these gases, microwaves are supplied from the antenna part 60 of the plasma formation part 6 (6A to 6C).

While the supply of the respective gases and the formation of plasma are performed in this manner, an internal pressure of the vacuum container 11 is kept at a predetermined pressure having a range of, for example, 66.5 Pa (0.5 Torr) to 665 Pa (5 Torr), specifically 266 Pa (2 Torr) in this example. In the raw material gas unit 3, the DCS gas and the Ar gas are discharged from the gas discharge ports 331 and the purge gas discharge port 311 at predetermined flow rates, respectively, and are exhausted from the exhaust port 321. As a result, the DCS gas flows inside the adsorption region R1 which is a limited region extending up to the exhaust port 321 surrounding the gas discharge ports 331. When the wafer W reaches the adsorption region R1 with the rotation of the rotary table 2, the DCS gas as a raw material gas containing silicon is supplied and adsorbed onto the surface of the wafer W (step S3). Subsequently, the rotary table 2 is further rotated, the wafer W is moved outward of the adsorption region R1 and the purge gas is supplied to the surface of the wafer W so that the adsorbed surplus DCS gas is removed.

In the first modification region r1, the $H_2$ gas is plasmarized and the flow of the $H_2$ gas oriented to the exhaust port 190B is formed. When the wafer W reaches the first modification region r1 with the rotation of the rotary table 2, the first modification process is performed by the active species of the $H_2$ gas contained in the plasma. Dangling bonds in the SiN film are bonded to H, whereby the SiN film is modified into a dense film (step S4).

In the reaction region R2, the $NH_3$ gas is plasmarized and the flow of the $NH_3$ gas oriented to the exhaust port 190A is formed. When a respective wafer W reaches the reaction region R2 with the rotation of the rotary table 2, active species such as radicals including N (nitrogen) generated from the $NH_3$ gas and constituting plasma of the $NH_3$ gas are supplied to the surface of the respective wafer W. Thus, the active species of the $NH_3$ gas are supplied to the wafer W and reacts with the raw material existing on the wafer W to form a nitride layer (SiN layer) (step S5).

In the second modification region r2, the $H_2$ gas is plasmarized, and the flow of the $H_2$ gas oriented to the exhaust port 190C is formed. When the wafer W reaches the second modification region r2 with the rotation of the rotary table 2, the first modification process is performed by the active species of the $H_2$ gas contained in the plasma so that the SiN film is modified to a dense film (step S6).

The cycle of the processes respectively performed in the adsorption region R1, the first modification region r1, the reaction region R2 and the second modification region r2 is defined as one film forming cycle. Then, in step S7, the supply of the DCS gas, the supply of the active species of the $H_2$ gas, the supply of the active species of the $NH_3$ gas and the supply of the active species of the $H_2$ gas are sequentially repeated until it is determined that the film forming cycle has been repeated a predetermined number of times, whereby SiN is deposited on the surface of the wafer W to form a SiN layer.

In step S7, when it is determined that the film forming cycle has been repeated the predetermined number of times, namely when the film thickness of the SiN film is increased and the SiN film having a desired film thickness is formed, the film formation process is terminated. For example, the discharge and exhaust of the respective gases in the raw material gas unit 3 is stopped. Furthermore, the supply of the $NH_3$ gas and the supply of the electric power in the reaction region R2, and the supply of the $H_2$ gas in the first modification region r1 and the second modification region r2 are stopped, respectively.

Subsequently, a step (second modification process) of activating the $H_2$ gas and the $NH_3$ gas, supplying the activated gases to the wafer W and modifying the SiN film is performed. For example, the second modification process is started in a state in which the internal pressure of the vacuum container 11 and the temperature of the rotary table 2 are made the same as those in the film formation process and in which the rotary table 2 is rotated (step S8). Then, in the first modification region r1 and the second modification region r2, the $H_2$ gas and the $NH_3$ gas as second modification gases are supplied and the electric power is supplied to the plasma formation parts 6B and 6C, thereby performing the second modification process (step S9). The supply of the $NH_3$ gas and the Ar gas in the raw material gas unit 3 and the reaction region R2 and the supply of the electric power to the plasma formation part 6A remain stopped.

In the first modification region r1 and the second modification region r2, a mixed gas of the H2 gas and the NH3 gas is supplied from the first gas discharge ports 703 and the second gas discharge ports 704, respectively. That is to say, in this example, the $H_2$ gas and the $NH_3$ gas are simultaneously supplied to the wafer W. Then, the $H_2$ gas and the $NH_3$ gas are activated (plasmarized) by the microwaves of the plasma formation parts 6B and 6C, whereby active species of the $H_2$ gas and active species of the $NH_3$ gas are generated. Then, the dangling bonds in the SiN film are bonded to H by the active species, whereby the SiN film is modified into a dense film. Since the DCS gas contains chlorine (Cl), when the DCS gas is used as a raw material gas, there is a possibility that a chlorine component is incorporated as an impurity into the SiN film to be formed. Therefore, by activating the mixed gas of the $H_2$ gas and the $NH_3$ gas in the first and second modification regions r1 and r2, the chlorine component contained in the thin film is desorbed by the action of H radicals, whereby the SiN film is modified into a more pure (dense) nitride film.

The reason for using the plasma of the $H_2$ gas and the $NH_3$ gas in the second modification process is to make sure that, even for a pattern having a large aspect ratio, the H radicals-based modification process proceeds almost uniformly in the vertical direction of the recess 81. In the surface structure of the wafer W shown in FIG. 6, regarding the SiN film 83 formed on the surface of the wafer W, four positions in the vertical direction of the SiN film 83 are defined as a top position A, a recess upper position B, a recess lower position C and a bottom position D.

According to the example described later, it is recognized that in the modification process using the plasma of the $H_2$ gas, a vertical direction quality of the SiN film 83 formed in the recess 81 is uneven and specifically, the modification process does not proceed in the bottom position D as compared with the top position A. This is presumably because the H radicals generated by the plasmarization of the $H_2$ gas have a short lifetime and the H radicals hardly move into the bottom position D of the recess 81 in a pattern having a large aspect ratio.

On the other hand, it is recognized that when the modification process is performed by the plasma of the $H_2$ gas and the $NH_3$ gas as in the present disclosure, the uniformity of the film quality in the vertical direction of the recess 81 is improved as compared with the example described later. The reason for this is presumed as follows. That is to say, by the plasmarization of the $NH_3$ gas, N radicals, H radicals, NH radicals, $NH_2$ radicals and the like are generated. The $NH_2$ radicals and the NH radicals are further decomposed to generate H radicals. Therefore, in a region near the bottom position D of the recess 81, the $NH_3$ gas is decomposed to generate H radicals, whereby the H radicals move into the bottom position D. Thus, it is considered that the modification process proceeds sufficiently even at the bottom position D and the uniformity of the film quality in the vertical direction of the recess 81 is improved.

In parallel with the modification process using the H radicals, a nitridation process of the SiN film is also performed with the N radicals generated by plasmarizing the $NH_3$ gas. Therefore, the nitridation process in the film formation process can be compensated. In the first modification process, when the $H_2$ gas and the $NH_3$ gas are used as the modification gases, the amount of N radicals in one film forming cycle increases, and the nitridation process proceeds more easily than the modification process using the H radicals. Therefore, only the $H_2$ gas is used as a modification gas in the modification process. Even if the $NH_3$ gas is mixed with the $H_2$ gas, it is preferable that the $NH_3$ gas is smaller in amount than the $H_2$ gas.

An example of process conditions in the second modification process is as follows. The total supply amount of the H₂ gas supplied from the first gas discharge ports 703 and the second gas discharge ports 704 is 1,000 ml/min (sccm), the total supply amount of the NH₃ gas is 4,250 ml/min, the internal pressure of the vacuum container 11 is 266 Pa, the temperature of the rotary table 2 is 475 degrees C., and the rotation speed of the rotary table 2 is 20 rpm.

After the second modification process is executed for a preset time based on the above operation, the supply of the H₂ gas and the NH₃ gas, the supply of the electric power to the plasma formation parts 6B and 6C and the heating of the wafer W by the heater 46 are stopped to terminate the second modification process. Then, when the temperature of the wafer W drops to a preset temperature, the wafers W are sequentially unloaded from the loading/unloading port 101 in the reverse sequence of that in the loading operation (step S10).

According to the present embodiment, after the SiN film is formed along the inner wall surface of the recess 81 constituting the pattern formed on the surface of the wafer W, the H₂ gas and the NH₃ gas are activated (plasmarized). The activated gases are supplied to the wafer W to modify the SiN film. When the NH₃ gas is used, it is inferred that active species (H radical) of hydrogen are generated after the NH₃ gas moves to the lower side in the recess 81. Therefore, if the NH₃ gas is used as a modification gas in addition to the H₂ gas, it is possible to make the degree of modification of the SiN film uniform in the vertical direction of the recess 81 and to enhance the uniformity of the film quality of the SiN film in the vertical direction of the recess 81 while making the SiN film dense.

In this way, the film quality of the SiN film is made uniform in the vertical direction of the recess 81. Therefore, in a subsequent process, when a sacrificial film is embedded in the recess 81 in which the SiN film is formed, and when the sacrificial film is etched, it is possible to make the degree of etching of the SiN film uniform in the vertical direction of the recess 81. Thus, the dimensional accuracy of the SiN film is increased. For example, in a case where a wiring material is embedded after removing the sacrificial film, it is possible to improve the electrical characteristics of a device.

In the second modification process, the ratio (NH₃ gas/H₂ gas) of the total supply amount of the NH₃ gas to the total supply amount of the H₂ gas is set to, for example, 0.1 to 2.0. For example, as described above, when simultaneously discharging the H₂ gas and the NH₃ gas to the process atmosphere, the ratio of the flow rate of the NH₃ gas to the flow rate of the H₂ gas is set to, for example, 0.1 to 2.0. If the ratio is smaller than 0.1, the modification process at the bottom position D of the recess 81 does not proceed. If the ratio is larger than 2.0, there is a concern that the nitridation process will proceed with priority over the modification process. In some embodiments, the ratio may be set to 1.0 or less. This is because if the proportion of the NH₃ gas in the mixed gas exceeds 50%, there is a possibility that NH groups are incorporated into the SiN film, thereby suppressing improvement of the denseness of the SiN film.

In the above example, the first modification process is performed in the film forming cycle. However, the first modification process may be not performed. In the case where the first modification process is not performed, in the film formation process, the supply of the gases to the first modification region r1 and the second modification region r2 and the supply of the electric power to the plasma formation parts 6B and 6C are stopped. Other processes are performed in the same manner as the above-described film formation process.

Although the aforementioned film formation processing apparatus has been described to include the first modification region r1 and the second modification region r2, the film formation processing apparatus may be configured to include at least one of the first modification region r1 and the second modification region r2. Furthermore, the present disclosure is not limited to the configuration in which the dedicated plasma formation part (plasmarization mechanism) 6 is installed in each of the reaction region and the modification region. For example, a process region that serves as both the reaction region and the modification region may be formed and a plasmarization mechanism may be used in combination. In this case, in the process of forming the SiN film, the NH₃ gas is supplied from the process region and is activated by the plasmarization mechanism. In the modification process, the H₂ gas and the NH₃ gas are supplied from the process region and are activated by the plasmarization mechanism.

Furthermore, in the step of performing the second modification process, the process conditions such as the internal pressure of the vacuum container 11, the temperature of the wafer W and the rotation speed of the rotary table 2 are the same as those of the process of forming the SiN film. Therefore, it is possible to suppress a decrease in throughput. Further, such process conditions may be changed. In the process of performing the second modification process, electric power may be supplied to the plasma formation part 6A even in the reaction region R2 to form plasma. This is because the H₂ gas and the NH₃ gas may sometimes flow out from the first modification region r1 and the second modification region r2 into the reaction region R2 and because the modification process may be performed by the active species of the H₂ gas and the NH₃ gas even in the reaction region R2.

The configurations of the reaction gas supply part and the modification gas supply part are not limited to the above examples. For example, the reaction gas supply part may be a single gas injector. Similar to the modification gas supply part, the first and second gas discharge ports 703 and 704 may be formed in the plasma formation part 6A to supply the NH₃ gas. In addition, the modification gas supply part may be configured by a gas injector just like the reaction gas supply part.

Furthermore, the raw material gas unit 3 does not necessarily need to include the purge gas discharge port 311. For example, an additional exhaust port may be formed outside the exhaust port 321. The NH₃ gas and the H₂ gas may be exhausted from a region other than the adsorption region R1 through the additional exhaust port so that the atmosphere in the adsorption region R1 is separated from the external atmosphere.

Figure 8:
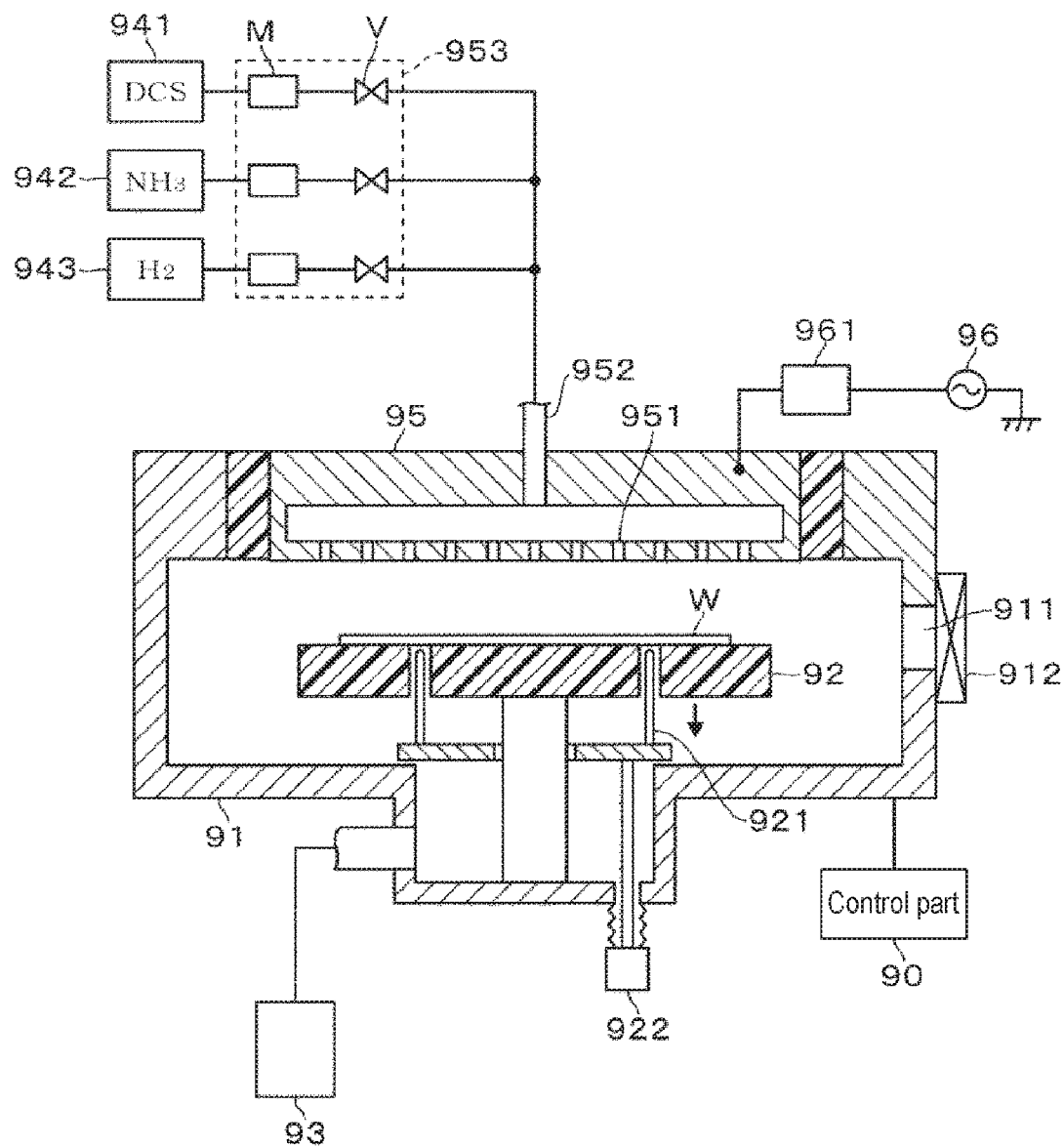
FIG. 8 is a vertical sectional side view showing another example of the film formation processing apparatus to which the present disclosure is applied.

Furthermore, the film formation processing apparatus for carrying out the method of the present disclosure is not limited to the above configuration. FIG. 8 shows another example of the film formation processing apparatus for carrying out the method of the present disclosure. In this film formation processing apparatus, the wafer W is first mounted on a mounting part 92 inside a vacuum container 91. The interior of the vacuum container 91 is set to a vacuum atmosphere by an exhaust mechanism 93. The wafer W is heated by, for example, a heater installed in the mounting part 92. Then, a DCS gas as a raw material gas is supplied from a DCS gas supply source 941 through a gas discharge port 951 formed in a gas supply part 95 to have Si adsorbed onto the surface of the wafer W. Subsequently, the supply of the DCS gas is stopped and the interior of the vacuum container 91 is exhausted to discharge the DCS gas.

Subsequently, an $NH_3$ gas as a reaction gas is supplied from an $NH_3$ gas supply source 942, and high frequency is supplied from a high frequency power supply part 96 to the gas supply part 95. As a result, capacitively coupled plasma is generated by an upper electrode constituting the gas supply part 95 and a lower electrode constituting the mounting part 92. Thus, the $NH_3$ gas is activated, and the raw material existing on the wafer W is nitrided by the active species of the $NH_3$ gas to form a SiN layer which is a nitride layer. Subsequently, the supply of the $NH_3$ gas and the supply of the high frequency are stopped, and the interior of the vacuum container 91 is exhausted to discharge the $NH_3$ gas. The process of forming the SiN layer by the supply of the DCS gas and the supply of the $NH_3$ gas is repeated plural times to form a SiN film having a predetermined film thickness.

Thereafter, a $H_2$ gas and an $NH_3$ gas are supplied as modification gases from a $H_2$ gas supply source 943 and the $NH_3$ gas supply source 942 to the vacuum chamber 91 kept in the vacuum atmosphere. The high frequency is supplied to the gas supply part 95 to activate the $H_2$ gas and the $NH_3$ gas. The $H_2$ gas and the $NH_3$ gas thus activated are supplied to the wafer W to perform a step of modifying the SiN film. The step of forming the SiN film on the wafer W and the step of modifying the SiN film are executed by a control part 90. In FIG. 8, reference numeral 911 denotes a transfer port, reference numeral 912 denotes a gate valve, reference numeral 921 denotes delivery pins which are raised and lowered by an elevating mechanism 922, reference numeral 952 denotes a supply path, reference numeral 953 denotes a flow rate adjustment part including a mass flow controller M and a valve V, and reference numeral 961 denotes a matcher.

Furthermore, the film formation processing apparatus for carrying out the method of the present disclosure may be, for example, a vertical type film formation processing apparatus in which a wafer boat holding plural sheets of wafers is loaded into a reaction vessel from below. In this apparatus, a portion of the reaction vessel in the circumferential direction is formed as a plasma formation chamber so as to laterally protrude along the longitudinal direction of the reaction vessel extending in the vertical direction. An electrode is attached to a side wall of the plasma formation chamber extending in the vertical direction. High frequency is applied to the electrode to generate capacitive plasma. In some embodiments, a supply nozzle of a raw material gas, a supply nozzle of a reaction gas and a supply nozzle of a modification gas may be installed inside the plasma formation chamber. Further, the interior of the reaction vessel is set to a vacuum atmosphere. The wafer boat is heated and rotated. In this state, a process of forming a SiN layer by supplying a raw material gas and then supplying a reaction gas is repeated plural times to form a SiN film having a predetermined thickness. Subsequently, a $H_2$ gas and an $NH_3$ gas are supplied as modification gases to the reaction vessel kept in the vacuum atmosphere. These gases are activated. The gases thus activated are supplied to the wafer W to perform a process of modifying the SiN film.

In the step of modifying the SiN film after the formation of the SiN film, one and the other of the activated $H_2$ gas and the activated $NH_3$ gas may be sequentially supplied to the wafer W. In this case, the ratio of the total supply amount of the $H_2$ gas and total supply amount of the $NH_3$ gas may be adjusted, for example, by setting the flow rates of the $H_2$ gas and the $NH_3$ gas to be the same and adjusting the supply time of the $H_2$ gas and the supply time of the $NH_3$ gas to the wafer W. In some embodiments, the step of modifying the SiN film may include supplying one of the activated $H_2$ gas and the activated $NH_3$ gas to the wafer W, supplying the other to the wafer W and simultaneously supplying both to the wafer W.

Example

Using the film formation processing apparatus shown in FIG. 1, a SiN film was formed on a wafer having a recess 81 constituting a pattern formed therein, and then a second modification process was performed. The film quality of the SiN film thus formed was evaluated (Example 1). The film quality was similarly evaluated for a case where the second modification process was not performed (Comparative Example 1) and a case where the second modification process was performed using only the $H_2$ gas (Comparative Example 2). The aspect ratio of the wafer having the recess 81 constituting a pattern formed therein was 10, and the SiN film was formed under the following film formation conditions in Example 1 and Comparative Examples 1 and 2.
(Formation Condition of SiN film)

Using the film formation processing apparatus shown in FIG. 1, a DCS gas (DCS concentration: 100 vol %) was supplied to the adsorption region R1 at a flow rate of 1,190 ml/min, and an $NH_3$ gas ($NH_3$ concentration: 100 vol %) and an Ar gas (Ar concentration: 100 vol %) were supplied to the reaction region R2 at flow rates of 1.000 ml/min and 1,000 ml/min, respectively. The internal pressure of the vacuum container was set to 267 Pa (2 Torr), the temperature of the wafer W was set to 475 degrees C., and the rotation speed of the rotary table 2 was set to 20 rpm. A film formation process was performed while the rotary table 2 rotates a total of 87 times.
(Condition of Second Modification Process of Example 1)

After the film formation process, in Example 1, the supply of the DCS gas, the $NH_3$ gas, and the Ar gas was stopped, and the $H_2$ gas and the $NH_3$ gas were supplied as a second modification gas to the first modification region r1 and the second modification region r2 at flow rates of 4,520 ml/min and 1,000 ml/min. Similar to the film formation process, the internal pressure of the vacuum container 11 was set to 267 Pa, the temperature of the wafer W was set to 475 degrees C., and the rotation speed of the rotary table 2 was set to 20 rpm. A modification process was performed for 300 seconds.
(Condition of Second Modification Process of Comparative Example 1)

In Comparative Example 2, after the film formation process, the supply of the DCS gas, the $NH_3$ gas and the Ar gas was stopped, and the $H_2$ gas was supplied to each of the first modification region r1 and the second modification region r2 at a flow rate of 1,000 sccm. In addition, the internal pressure of the vacuum container 11 was set to 66.5 Pa (0.5) Torr, the temperature of the wafer W was set to 475 degrees C., and the rotation speed of the rotary table 2 was set to 20 rpm. A modification process was performed for 300 seconds.

Figure 9:
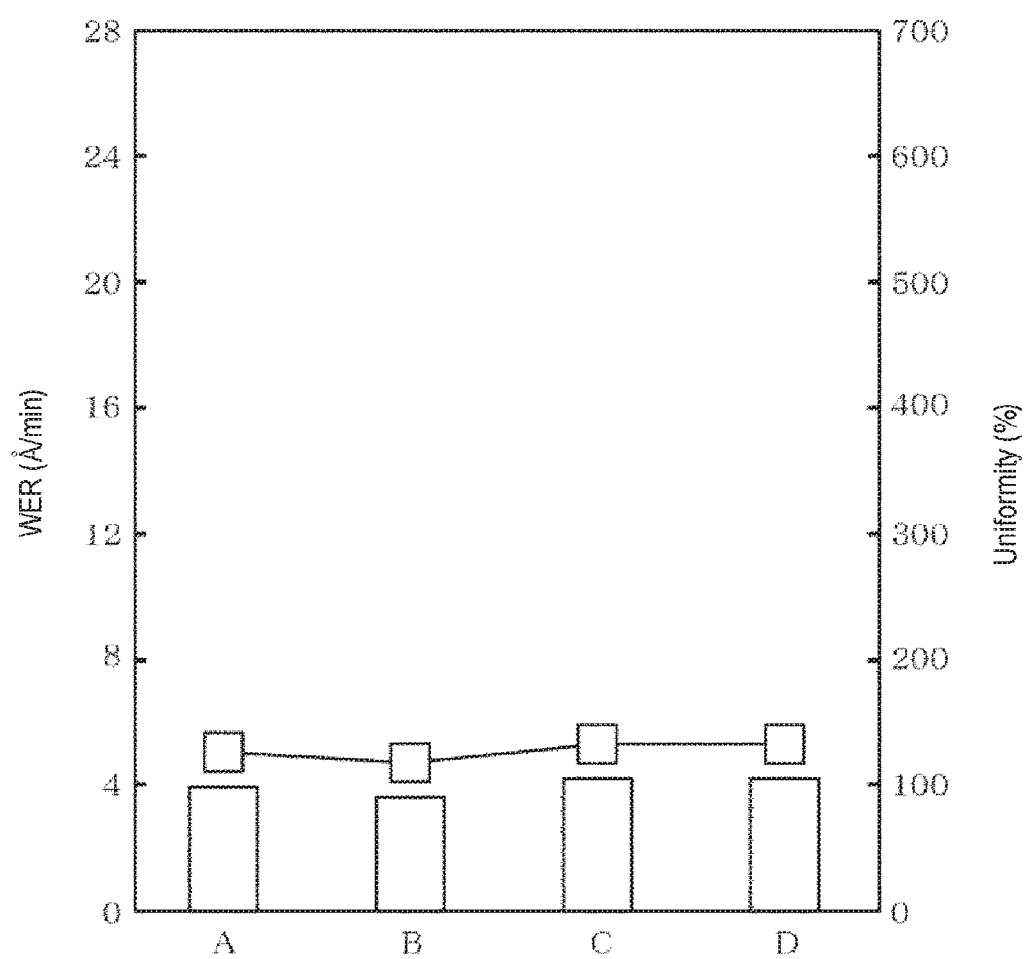
FIG. 9 is a characteristic diagram showing a film thickness distribution of an example.
Figure 10:
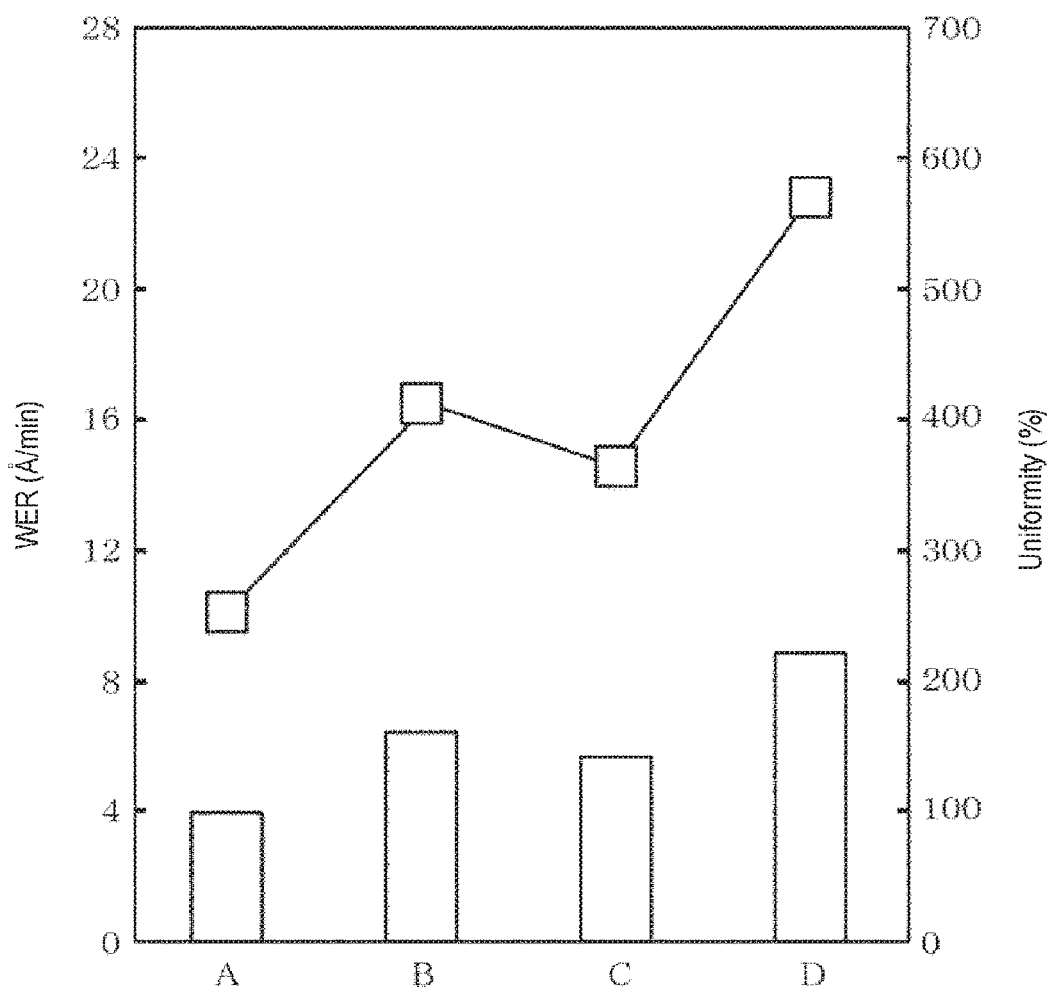
FIG. 10 is a characteristic diagram showing a film thickness distribution of a comparative example.
Figure 11:
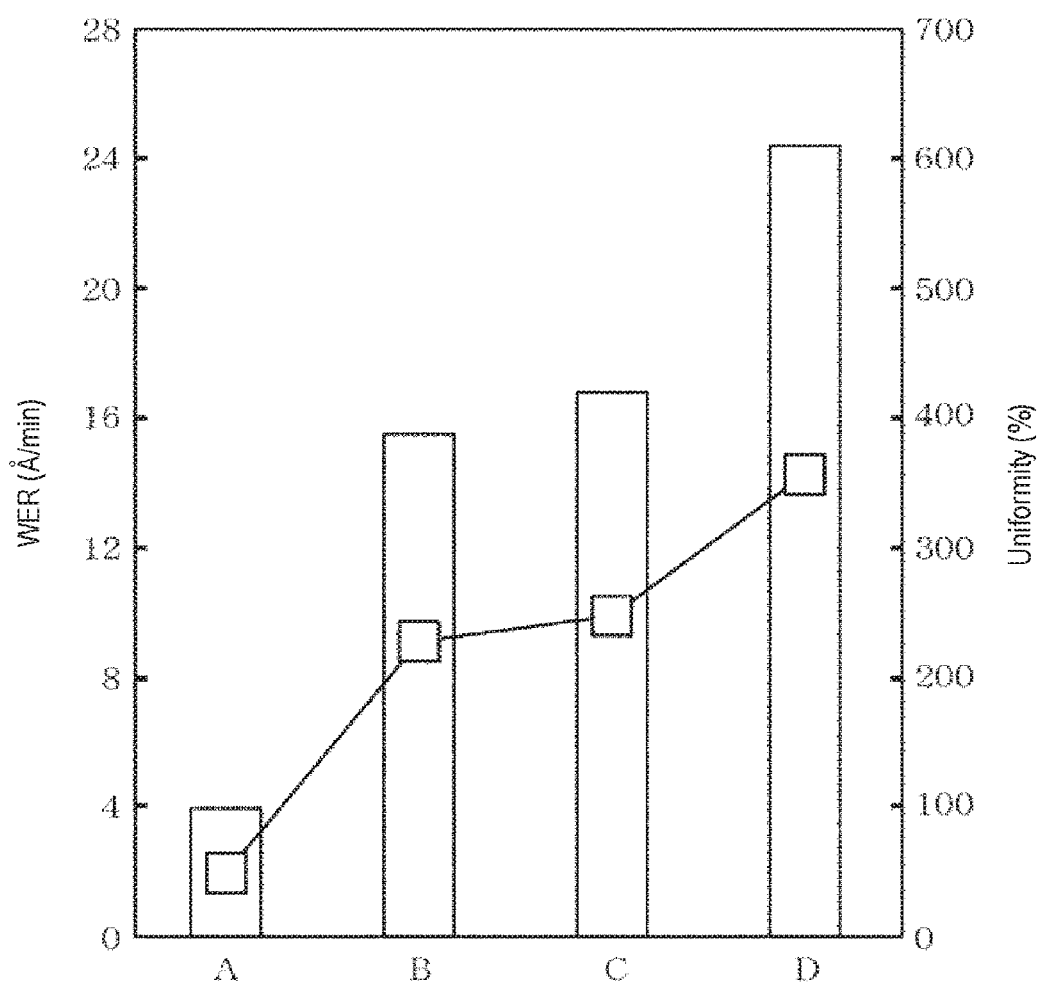
FIG. 11 is a characteristic diagram showing a film thickness distribution of a comparative example.

In the evaluation of the film quality, a wet etching rate (WER [Å/min]) based on a hydrofluoric acid having a concentration of 0.5% by weight was measured at four positions, namely the top position A, the recess upper position B, the recess lower position C and the bottom position D of the recess 81 shown in FIG. 6. The measurement results of the wet etching rate according to the Example 1 are shown in FIG. 9, and the measurement results of the wet etching rate according to Comparative Examples 1 and 2 are shown in FIGS. 10 and 11, respectively. In the figures, the vertical axis at the left side represents the wet etching rate (WER), and the vertical axis at the right side represents the uniformity of the wet etching rate. The uniformity of the wet etching rate is a relative value when the wet etching rate at the top position A of the recess 81 is assumed as 100.

In the results of Comparative Example 1 (FIG. 10) in which the second modification process was not performed after the film formation process, it was recognized that the wet etching rate is greatly different at the top position A, the recess upper position B, the recess lower position C and the bottom position D of the recess 81, the wet etching rate at the bottom position D is higher than that at the top position A, and the uniformity of the wet etching rate in the vertical direction of the recess 81 is poor.

In the results of Comparative Example 2 (FIG. 11) in which the second modification process was performed after the film formation process using only the $H_2$ gas, it was recognized that the wet etching rate is reduced at the top position A, the recess upper position B, the recess lower position C and the bottom position D of the recess 81 as compared with Comparative Example 1 and the film is made dense. However, it was confirmed that although the wet etching rate at the top position A is extremely low, the wet etching rate at the bottom position D is high, as a result of which the uniformity of the wet etching rate in the vertical direction of the recess 81 is deteriorated as compared with Comparative Example 1. This is presumably because, due to the short lifetime of H radicals, many H radicals reach the top portion of the recess 81 whereby the modification process proceeds promptly, but few H radicals reach the bottom portion of the recess 81 whereby the modification process does not proceed at the bottom portion. In addition, it was recognized from the results of Comparative Example 1 and Comparative Example 2 that on a flat surface of a bare wafer or the like, the film quality is improved by the modification process using the $H_2$ gas.

In Example 1, as shown in FIG. 9, it was recognized that the wet etching rate is low at each of the top position A, the recess upper position B, the recess lower position C and the bottom position D of the recess 81 as compared with Comparative Example 2, and the film is made dense even in the bottom portion of the recess 81. Further, it was confirmed that the wet etching rate in the vertical direction of the recess 81 is uniform, and the uniformity of the wet etching rate in the vertical direction is greatly improved. This is presumably because, due to the plasmarization of the $NH_3$ gas rather than the plasmarization of the $H_2$ gas, many H radicals reach not only the top portion but also the bottom portion of the recess 81 whereby the modification process proceeds promptly. It was confirmed that the uniformity of the film quality in the vertical direction is improved as the wet etching rate of the SiN film in the vertical direction is made uniform in this way.

In Comparative Example 2, in order to improve the modification effect, the internal pressure of the vacuum container 11 in the second modification process is set lower than in the film formation process. However, in Example 1, the second modification process is performed by setting the internal pressure of the vacuum container 11 in the second modification process to be the same as that in the film formation process. Thus, according to the method of the present disclosure, the modification effect can be sufficiently obtained even with the same pressure as that in the film formation process. Therefore, the modification process can be performed while suppressing the decrease in throughput.

According to the present disclosure in some embodiments, a silicon nitride film is formed along an inner wall surface of a recess constituting a pattern formed on a surface of a substrate. Thereafter, a hydrogen gas and an ammonia gas are activated. The gases thus activated are supplied to the substrate. Dangling bonds of the silicon nitride film are bonded by the active species of the hydrogen gas, thereby making the silicon nitride film dense and modifying the silicon nitride film. When the ammonia gas is used, it is inferred that the active species of hydrogen are generated after the ammonia gas enters the lower side in the recess. Therefore, if the ammonia gas is used as a modification gas in addition to the hydrogen gas, it is possible to make the degree of modification of the silicon nitride film uniform in the vertical direction of the recess. This makes it possible to enhance the uniformity of a film quality of the silicon nitride film in the vertical direction of the recess while making the silicon nitride film dense.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   forming a silicon nitride film along an inner wall surface of a recess constituting a pattern formed on a surface of a substrate in a vacuum atmosphere;
   embedding a sacrificial film in the recess; and
   removing the sacrificial film by etching the sacrificial film,
   wherein the forming the silicon nitride film includes:
   forming the silicon nitride film on the substrate by repeating, plural times, a process of supplying a raw material gas containing silicon to the substrate and subsequently, supplying an ammonia gas to the substrate to generate a silicon nitride on the substrate; and
   subsequently, modifying the silicon nitride film by supplying a hydrogen gas and an ammonia gas simultaneously, activating the hydrogen gas and the ammonia gas, and supplying the activated hydrogen gas and the activated ammonia gas to the substrate simultaneously.

2. The method of claim 1, wherein an aspect ratio of the recess is 5 to 40.

3. The method of claim 1, wherein a ratio of a total supply amount of the activated ammonia gas to a total supply amount of the activated hydrogen gas in the modifying the silicon nitride film is 0.1 to 2.0.

4. The method of claim 1, wherein the method is carried out by an apparatus of manufacturing a semiconductor device,
   the apparatus including: a rotary table provided with a mounting part for mounting the substrate thereon and configured to revolve the substrate; a raw material gas supply part disposed to face the rotary table and provided with a discharge part for discharging the raw material gas including silicon and an exhaust port formed to surround the discharge part; a reaction region and a modification region disposed so as to be spaced apart in a rotational direction of the rotary table with respect to the raw material gas supply part, the ammonia gas being supplied to the reaction region to nitride silicon, the hydrogen gas and the ammonia gas being supplied to the modification region to modify the silicon nitride film; and a plasmarization mechanism configured to plasmarize the ammonia gas and the hydrogen gas supplied to the reaction region and the modification region, wherein the forming the silicon nitride film is performed by mounting the substrate on the rotary table and rotating the rotary table so that the substrate repeatedly passes through below the raw material gas supply part and the reaction region, and wherein the modifying the silicon nitride film is performed by, after the forming the silicon nitride film, rotating the rotary table so that the substrate passes through the modification region.

* * * * *